(12) United States Patent
Bjornsen

(10) Patent No.: US 7,129,866 B2
(45) Date of Patent: Oct. 31, 2006

(54) METHOD AND APPARATUS FOR OPERATING A DELTA SIGMA ADC CIRCUIT

(75) Inventor: Johnny Bjornsen, Trondheim (NO)

(73) Assignee: Nordic Semiconductor ASA, Tiller (NO)

(*) Notice: Subject to any disclaimer, the term of this patent is extended or adjusted under 35 U.S.C. 154(b) by 0 days.

(21) Appl. No.: 11/150,025

(22) Filed: Jun. 10, 2005

(65) Prior Publication Data
US 2005/0275571 A1 Dec. 15, 2005

Related U.S. Application Data

(60) Provisional application No. 60/579,017, filed on Jun. 10, 2004.

(51) Int. Cl.
*H03M 1/06* (2006.01)
(52) U.S. Cl. ............... 341/118; 341/155; 341/143
(58) Field of Classification Search ............... 341/120, 341/131, 143, 118, 117, 119, 161
See application file for complete search history.

(56) References Cited

U.S. PATENT DOCUMENTS

| | | | | |
|---|---|---|---|---|
| 5,153,593 | A | * | 10/1992 | Walden et al. ............ 341/143 |
| 5,500,645 | A | * | 3/1996 | Ribner et al. ............ 341/143 |
| 5,635,937 | A | * | 6/1997 | Lim et al. ............... 341/161 |
| 5,889,482 | A | * | 3/1999 | Zarubinsky et al. ....... 341/131 |
| 5,949,361 | A | * | 9/1999 | Fischer et al. ........... 341/143 |
| 5,982,313 | A | * | 11/1999 | Brooks et al. ........... 341/143 |
| 6,556,158 | B1 | * | 4/2003 | Steensgaard-Madsen .... 341/131 |

OTHER PUBLICATIONS

Siragusa et al., "Gain Error Correction Technique for Pipelined Analogue-to-Digital Converters," Electronics Letters, vol. 36, No. 7, Mar. 30, 2000.
Siragusa et al., "A Digitally Enhanced 1.8-V 15-bit 40-MSample/s CMOS Pipelined ADC," IEEE Journal of Solid-State Circuits, vol. 39, No. 12, Dec. 2004.
Qin et al., "Sigma-Delta ADC with Reduced Sample Rate Multibit Quantizer," IEEE Transactions on Circuits and Systems-II Analog and Digital Signal Processing, vol. 46, No. 6, Jun. 1999, 824-828.

* cited by examiner

*Primary Examiner*—Jean Bruner Jeanglaude
(74) *Attorney, Agent, or Firm*—Marshall, Gerstein & Borun LLP

(57) ABSTRACT

An analog-to-digital converter (ADC) system that converts an analog input signal into a digital output circuit includes a first stage analog-to-digital converter circuit coupled with a second stage analog-to-digital converter circuit. The first stage analog-to-digital converter circuit includes a quantizer, comparator, integrator, and a feedback digital-to-analog converter (DAC). The second stage analog-to-digital converter circuit includes a backend ADC that further quantizes the integrator output. Furthermore, the first stage analog-to-digital converter circuit also includes redundancy that corrects comparator offsets and prevents nonlinearities and harmonic distortion in the second stage analog-to-digital converter circuit caused by uncorrected comparator offsets.

16 Claims, 4 Drawing Sheets

METHOD AND APPARATUS FOR OPERATING A DELTA SIGMA ADC CIRCUIT

CROSS-REFERENCES TO RELATED APPLICATIONS

This application claims priority to U.S. Provisional Application Ser. No. 60/579,017, entitled, "Method and Apparatus for Operating a Delta Sigma ADC Circuit," filed Jun. 10, 2004, the disclosure of which is hereby expressly incorporated herein by reference.

TECHNICAL FIELD

This patent relates generally to analog-to-digital converters, and more specifically to an apparatus and a method for removing errors caused by comparator offsets.

BACKGROUND

Analog-to-digital converters (ADCs) are employed in a variety of electronic systems including computer modems, wireless telephones, satellite receivers, process control systems, etc. Such systems demand cost-effective ADCs that can efficiently convert an analog input signal to a digital output signal over a wide range of frequencies and signal magnitudes with minimal noise and distortion.

An ADC typically converts an analog signal to a digital signal by sampling the analog signal at pre-determined sampling intervals and generating a sequence of binary numbers via a quantizer, wherein the sequence of binary numbers is a digital representation of the sampled analog signal. Some of the commonly used types of ADCs include integrating ADCs, Flash ADCs, pipelined ADCs, successive approximation register ADCs, Delta-Sigma ($\Delta\Sigma$) ADCs, two-step ADCs, etc. Of these various types, the pipelined ADCs and the $\Delta\Sigma$ ADCs are particularly popular in applications requiring higher resolutions.

A $\Delta\Sigma$ ADC employs over-sampling, noise-shaping, digital filtering and digital decimation techniques to provide high resolution analog-to-digital conversion. One popular design of a $\Delta\Sigma$ ADC is multi-stage noise shaping (MASH) $\Delta\Sigma$ ADC. A MASH $\Delta\Sigma$ ADC is based on cascading multiple first-order or second-order $\Delta\Sigma$ ADCs to realize high-order noise shaping. An implementation of a MASH $\Delta\Sigma$ ADC is well known to those of ordinary skill in the art.

While a $\Delta\Sigma$ ADCs generally provide improved signal-to-noise ratio, improved stability, etc., comparator offsets in the single-bit or multi-bit quantizer of a $\Delta\Sigma$ ADC lead to increased distortion levels due to errors caused by the offsets. Generally speaking, the mechanism that causes distortion levels in $\Delta\Sigma$ ADCs to increase due to comparator offsets occurs when the comparator offsets are too high. Subsequent ADC stages will overload when trying to quantize the output of the preceding stage resulting in a failure to reproduce the output of the first stage due to overloading and clipping. Overloading leads to faulty digital recombination, and quantization error from the first stage quantizer will not be cancelled by digital recombination logic. Furthermore, this leads to leakage of the first stage quantization noise to the recombined output resulting in an increased noise floor and spurious components.

To achieve a $\Delta\Sigma$ ADC with low nonlinear distortion, a high tolerance to comparator offsets is desired.

BRIEF DESCRIPTION OF THE DRAWINGS

The present patent is illustrated by way of examples and not limitations in the accompanying figures, in which like references indicate similar elements, and in which:

FIG. 2$b$ is an exemplary diagram of reference voltages for a 2.5-bit quantizer having 7 comparators;

DETAILED DESCRIPTION OF THE EXAMPLES

Figure 1:
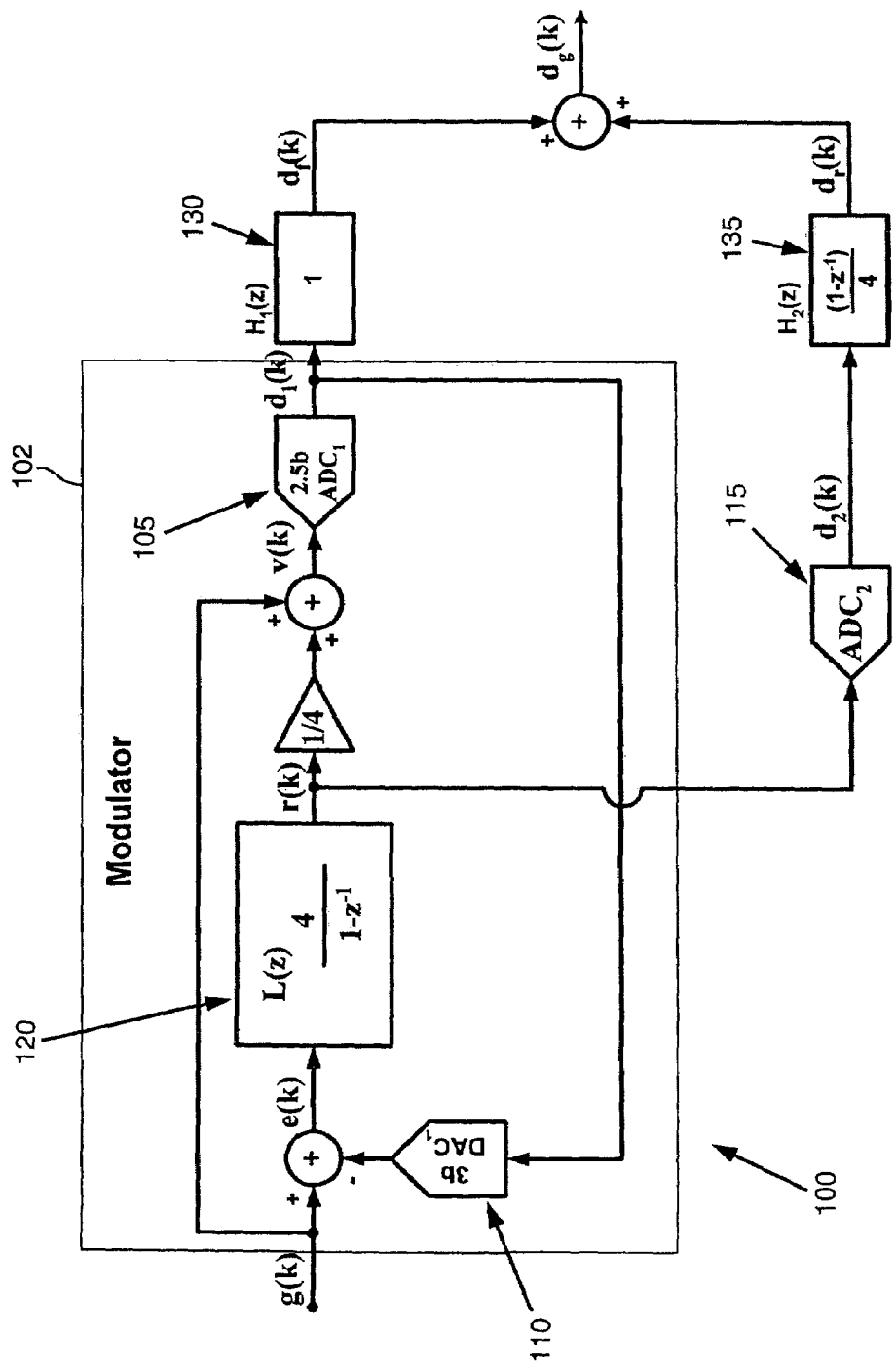
FIG. 1 is an exemplary block diagram of a first order $\Delta\Sigma$ ADC circuit illustrating comparator offset correction.

An analog-to-digital converter (ADC) system that converts an analog input signal into a digital output circuit includes a first stage coupled with a second stage. The first stage includes a quantizer, comparator, integrator, and a feedback digital-to-analog converter (DAC). The second stage includes a backend ADC that further quantizes the integrator output. Furthermore, the first stage also includes redundancy that corrects comparator offsets and prevents nonlinearities and harmonic distortion in the second stage caused by uncorrected comparator offsets.

An embodiment of the analog-to-digital converter (ADC) system includes a method of providing offset correction in an analog-to-digital converter circuit, the method comprising introducing redundancy in an output of a first stage of the analog-to-digital converter circuit; and using the redundancy to digitally correct an offset in an output of the analog-to-digital converter circuit.

In an alternate embodiment of the analog-to-digital converter (ADC) system introducing redundancy in the output of the first stage of the analog-to-digital converter circuit includes introducing redundancy in the output of a first stage of a delta-sigma analog-to-digital converter circuit.

In yet another embodiment of the analog-to-digital converter (ADC) system introducing redundancy in the output of the first stage of the analog-to-digital converter circuit includes providing a voltage headroom in the output of the first stage. Whereas in an alternate embodiment of the analog-to-digital converter (ADC) system introducing redundancy in the output of the first stage of the analog-to-digital converter circuit includes confining the output of the first stage to a fraction of an available output range.

In an alternate embodiment of the analog-to-digital converter (ADC) system, introducing redundancy in the output of the first stage of the analog-to-digital converter circuit includes modifying a quantizer of the first stage to remove an uppermost reference voltage from the output of the first stage. In an alternate embodiment of such an analog-to-digital converter (ADC) system, modifying the quantizer of the first stage of the analog-to-digital converter circuit includes increasing the number of comparators used in the quantizer of the first stage of the analog-to-digital converter circuit to a number higher than that required for generating an output necessary for a second stage of the analog-to-digital converter circuit.

An alternate embodiment of the analog-to-digital converter (ADC) system further comprises inputting the output from the first stage to a second stage of the analog-to-digital converter circuit and digitally recombining the output of the first stage of the analog-to-digital converter circuit with an output of the second stage of the analog-to-digital converter circuit to cancel an error in a residue voltage caused by the offsets from the quantizer of the first stage. In an alternate embodiment of such an analog-to-digital converter (ADC) system, digitally recombining the output of the first stage of the analog-to-digital converter circuit with the output of the second stage of the analog-to-digital converter circuit includes adding a least significant bit output from the first stage of the analog-to-digital converter circuit to a most significant bit output from the second stage of the analog-to-digital converter circuit. In yet another embodiment of such an analog-to-digital converter (ADC) system, digitally recombining the output of the first stage of the analog-to-digital converter circuit with the output of the second stage of the analog-to-digital converter circuit includes digitally recombining the output of the first stage of the analog-to-digital converter circuit with the output of the second stage of the analog-to-digital converter circuit using one of: (1) software; (2) hardware or (3) firmware.

An alternate embodiment of the analog-to-digital converter (ADC) system includes a first stage analog-to-digital converter circuit adapted to receive the analog input signal, to convert the analog input signal into a first stage digital output and to introduce redundancy in the first stage digital output; a second stage analog-to-digital converter circuit coupled to the first stage analog-to-digital converter circuit and adapted to generate a second stage digital output; and a digital correction unit coupled to the first stage analog-to-digital converter circuit and to the second stage analog-to-digital converter circuit, the digital correction unit adapted to combine the first stage digital output and the second stage digital output to generate the digital output signal and to use the redundancy to digitally correct an offset in the digital output signal. In an alternate embodiment of such an analog-to-digital converter (ADC) system, the first stage analog-to-digital converter circuit is a delta-sigma analog-to-digital converter circuit. In yet another embodiment of such an analog-to-digital converter (ADC) system, the first stage analog-to-digital converter circuit is further adapted to introduce redundancy by providing a voltage headroom in the first stage digital output.

In an alternate embodiment of such an analog-to-digital converter (ADC) system, the first stage analog-to-digital converter circuit is further adapted to introduce redundancy by confining the first stage digital output to a fraction of an available output range. Whereas in an alternate embodiment of such an analog-to-digital converter (ADC) system, the first stage analog-to-digital converter circuit is further adapted to introduce redundancy by modifying a quantizer of the first stage analog-to-digital converter circuit to remove an uppermost reference voltage from the first stage digital output. In an alternate embodiment of such an analog-to-digital converter (ADC) system the quantizer of the first stage analog-to-digital converter circuit includes a plurality of comparators and wherein the plurality of comparators including a higher number of comparators than that required for generating an output necessary for the second stage analog-to-digital converter circuit.

An alternate embodiment of the analog-to-digital converter (ADC) system is further adapted to input the first stage digital output to a second stage analog-to-digital converter circuit and further comprising a digital recombination circuit adapted to recombine the first stage digital output with the second stage digital output to cancel an error in a residue voltage caused by the offsets from the quantizer of the first stage analog-to-digital converter circuit. In an alternate embodiment of such an analog-to-digital converter (ADC) system the digital recombination circuit is further adapted to add a least significant bit first stage digital output to a most significant bit output from the second stage analog-to-digital converter circuit.

An embodiment of the present patent illustrates a first order $\Delta\Sigma$ ADC circuit 100 in FIG. 1, which employs redundancy and headroom for comparator offset to prevent stage overloading. The first order $\Delta\Sigma$ ADC circuit 100 includes a first stage 102 having a FLASH ADC, $ADC_1$ 105 containing a quantizer and comparators, and a 3-bit (3 b) feedback DAC, $DAC_1$ 110. The ADC circuit 100 also includes a second stage or a backend ADC, $ADC_2$ 115. The first stage includes an analog integrator 120. Recombination filters 130 and 135 filters the outputs of the first stage 102 and the second stage 115. While FIG. 1 shows a single backend $ADC_2$ 115, additional $\Delta\Sigma$ ADCs may be cascaded, as needed. $ADC_1$ 105 is nominally a 2 b resolution FLASH ADC which does not allow comparator offset. Increasing the resolution to 3 b introduces redundancy that can be used to correct for comparator offsets. The additional bit of resolution reduces the input range to a subsequent stage, resulting in a voltage headroom that allows for comparator offsets. Additionally, a 3 b resolution FLASH ADC minimizes nonlinearities and harmonic distortion caused by clipping due to uncorrected offsets.

Figure 2A:
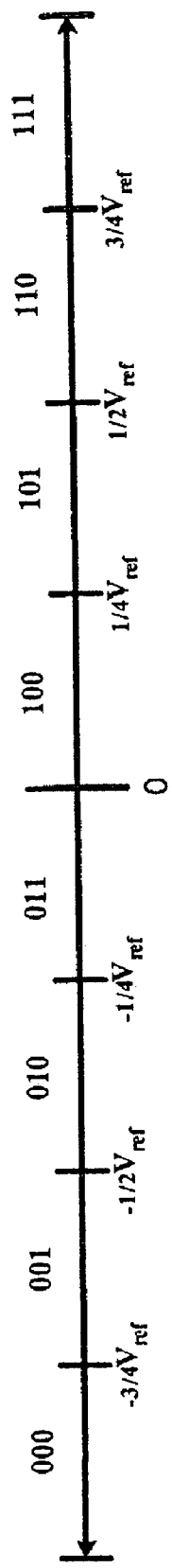
FIG. 2$a$ is an exemplary diagram of reference voltages for a 3-bit quantizer having 8 comparators.

FIG. 2a illustrates reference voltages for a 3 b quantizer consisting of 8 comparators. In a differential system, a residue voltage r(k) should be symmetric around zero and have a 0.5V magnitude if $DAC_1$ 110 uses +/−0.5V as a reference, while the $ADC_1$ 105 uses +/−1V as a reference. To use such a 3 b FLASH ADC (3 b FLASH) in the $\Delta\Sigma$ ADC circuit 100, a voltage equal to +/−0.5V ref must be made available to the switched capacitor feedback DAC shown in FIG. 3. In the alternative, the feedback DAC unit capacitor size C may be reduced to half the size of the feedback capacitor in order to create a residue voltage r(k) that is symmetric around a zero output voltage. For example, when the 3 b FLASH output code is 011, the 3 b FLASH input will be somewhere between −0.25V and 0V. When the input is near −0.25V, assuming that the previous integrator output was 0, $$y=-0.2499V*4+0+Vdac=-0.2499*4+0.5V=-0.5V.$$

Similarly, when the input is near 0, assuming that the previous integrator output was 0, $$y=0*4+Vdac=0*4+0.5V=0.5V.$$

Figure 2B:
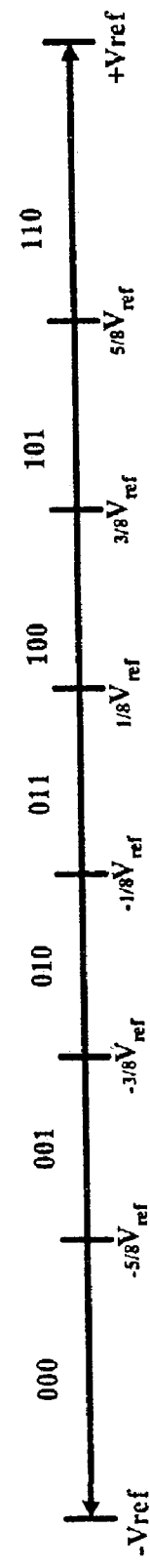

This scheme will allow for +/−0.5V redundancy for a second stage, which is enough for compensating for up to +/−½ LSB of comparator offsets. However, four unique reference voltages are required with this scheme, and 7 comparators are necessary. By introducing a systematic offset of −¼ LSB and removing the uppermost reference voltage level as illustrated in FIG. 2b, the resulting 2.5-bit output has only two bits used as effective bits for subsequent digital processing while the 0.5 bit introduces redundancy used for digital error correction. This is accomplished by starting with the 3 b configuration in FIG. 2a, removing the ¾ Vref comparator, and adding ⅛ Vref to all the resulting reference levels. The introduction of systematic offset as shown in FIG. 2b allows residue voltage generation that is systematic around zero and swings between +/−0.5V, but with +/−1V reference voltages for the feedback $DAC_1$ 110. For example, when the output of the 2.5 b FLASH is 011, no DAC voltages will be subtracted from the input, and the integrator output ranges between −0.5V and +0.5V. However, when the output of the 2.5 b FLASH is 010, the input is between −0.375V and −0.125V. When the input is near the −⅜V reference, $$y=-0.3749V*4+0+Vdac=-0.3749*4+1V=-0.5V.$$

Similarly, when the input is near the −⅛V reference, $$y=-0.125V*4+0+Vdac=-0.125*4+1V=0.5V.$$

The use of only two distinct reference voltages instead of four is a major benefit when designing the circuit, since the in-stage ADC and the DAC can be driven with the same reference voltages.

During digital processing, the digital output from the backend $ADC_2$ 115 is added to the output from $ADC_1$ 105 by aligning the LSB from $ADC_1$ 105 with the MSB from $ADC_2$ 115. The digital signal processing may be implemented by a digital signal processor using any one of software, hardware or firmware. The output of the first stage, labeled as $d_1$ (k) on FIG. 1, is added to the $d_2$(k) bit, also shown on FIG. 1 in the following way:

Assume a 3 b output being $d_{32}$, $d_{31}$, and $d_{30}$, where $d_{32}$ is the MSB and $d_{30}$ is the LSB. Also assume an exemplary 4-bit output $d_{r3}$, $d_{r2}$, $d_{r1}$, and $d_{r0}$, where $d_{r3}$ is the MSB and $d_{r0}$ is the LSB. The resulting 6-bit word will be the result of the addition illustrated in the table below.

|  | $d_{32}$ | $d_{31}$ | $d_{30}$ |  |  |  |
|---|---|---|---|---|---|---|
| + |  |  | $d_{r3}$ | $d_{r2}$ | $d_{r1}$ | $d_{r0}$ |
| Result | $d_{32}$ + leftover | $d_{31}$ + leftover | $d_{30}$ + $d_{r3}$ | $d_{r2}$ | $d_{r1}$ | $d_{r0}$ |

In this way, the effect of the systematic offset in the quantizer is removed and the tolerable comparator offset is still ±0.5 LSB.

Figure 3:
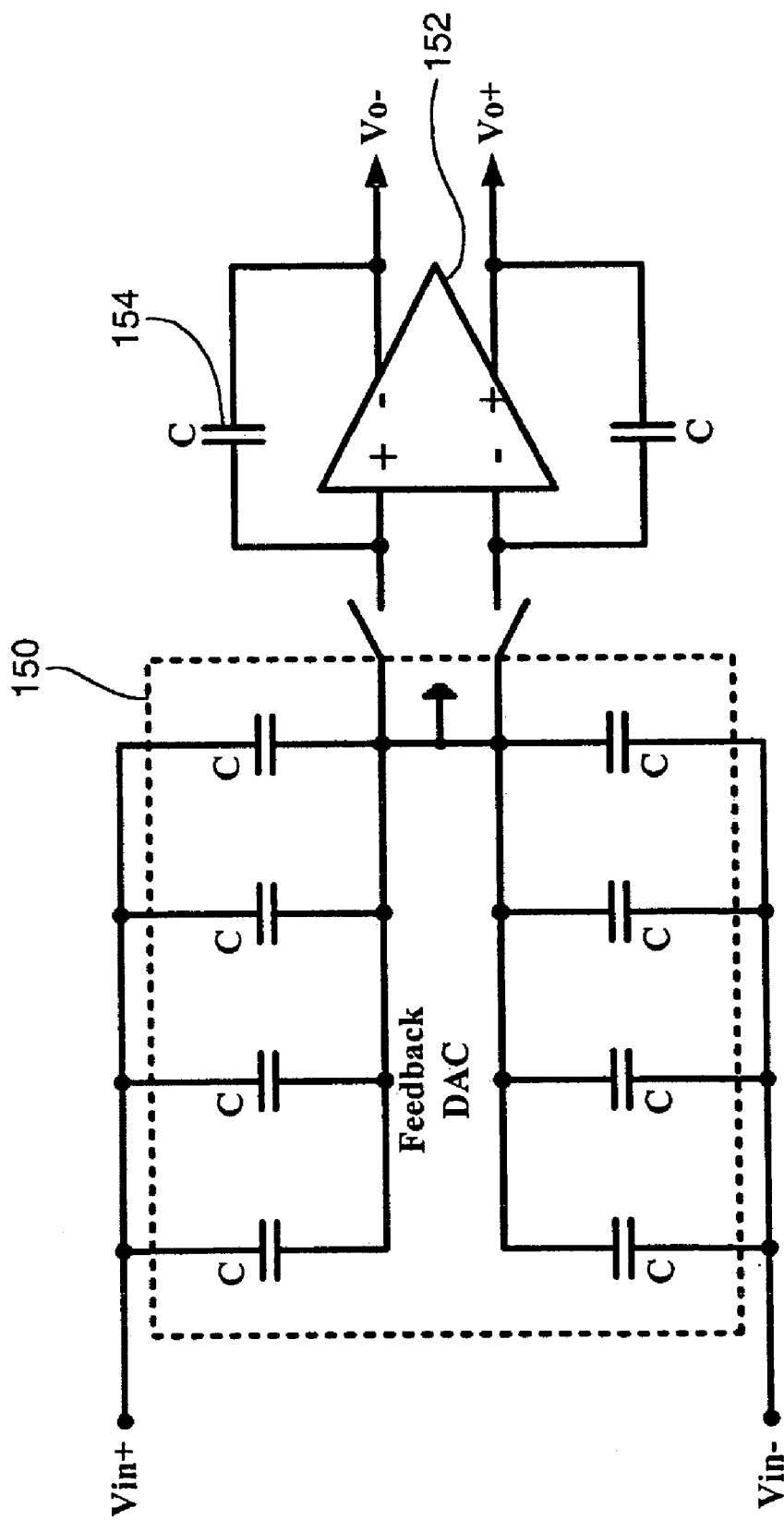
FIG. 3 is an exemplary diagram of an integrator sampling phase.
Figure 4:
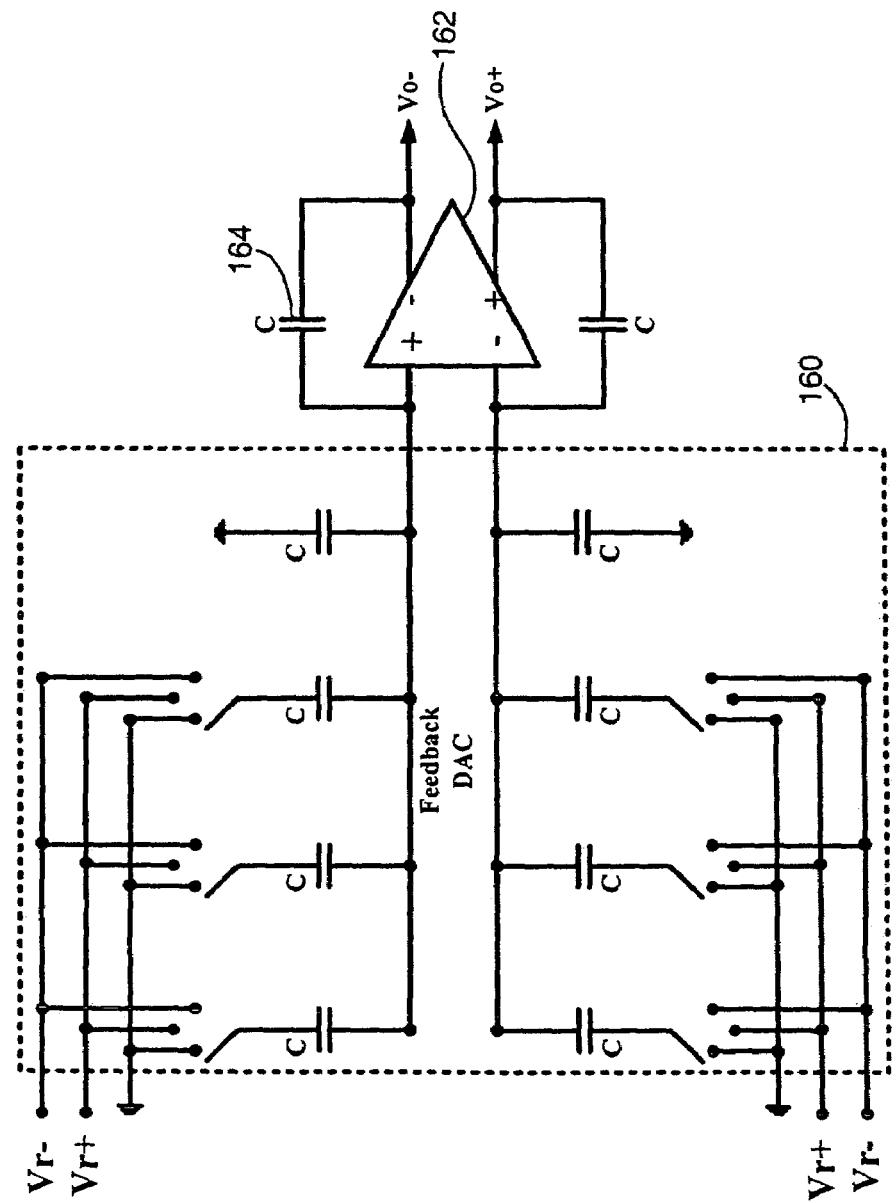
FIG. 4 is an exemplary diagram of an integrator feedback phase.

FIGS. 3 and 4 illustrate circuit hardware used for the analog integrator 120. The switches in each figure are controlled by the output of $ADC_1$ 105. More specifically, FIG. 3 represents a sampling phase 150 of the analog integrator 120 having a comparator 152 and integrating capacitors 154. While, FIG. 4 represents a feedback phase 160 of the analog integrator 120 having a comparator 162 and integrating capacitors 164. The ratio of the total sampling capacitance of the sampling phase 150 to the feedback capacitance of the feedback phase 160 defines the gain of the integrator 120. The aforementioned scheme allows a simple implementation of the feedback $DAC_1$ 110, utilizing only a single size unit capacitor C.

Although the forgoing text sets forth a detailed description of numerous different embodiments of the invention, it should be understood that the scope of the invention is defined by the words of the claims set forth at the end of this patent. The detailed description is to be construed as exemplary only and does not describe every possible embodiment of the invention because describing every possible embodiment would be impractical, if not impossible. Numerous alternative embodiments could be implemented, using either current technology or technology developed after the filing date of this patent, which would still fall within the scope of the claims defining the invention.

Thus, many modifications and variation may be made in the techniques and structures described and illustrated herein without departing from the spirit and scope of the present invention. Accordingly, it should be understood that the methods and apparatus described herein are illustrative only and are not limiting upon the scope of the invention.

What is claimed is:

1. A method of providing offset correction in an analog-to-digital converter circuit, the method comprising:
   introducing redundancy in an output of a first stage of the analog-to-digital converter circuit;
   using the redundancy to digitally correct an offset in an output of the analog-to-digital converter circuit;
   wherein introducing redundancy in the output of the first stage of the analog-to-digital converter circuit includes modifying a quantizer of the first stage to remove an uppermost reference voltage from the output of the first stage; and
   wherein modifying the quantizer of the first stage of the analog-to-digital converter circuit includes increasing the number of comparators used in the quantizer of the first stage of the analog-to-digital converter circuit to a number higher than that required for generating an output necessary for a second stage of the analog-to-digital converter circuit.

2. A method of claim 1, wherein introducing redundancy in the output of the first stage of the analog-to-digital converter circuit includes introducing redundancy in the output of a first stage of a delta-sigma analog-to-digital converter circuit.

3. A method of claim 1, wherein introducing redundancy in the output of the first stage of the analog-to-digital converter circuit includes providing a voltage headroom in the output of the first stage.

4. A method of claim 1, wherein introducing redundancy in the output of the first stage of the analog-to-digital converter circuit includes confining the output of the first stage to a fraction of an available output range.

5. A method of claim 1, further comprising:
   inputting the output from the first stage to a second stage of the analog-to-digital converter circuit; and
   digitally recombining the output of the first stage of the analog-to-digital converter circuit with an output of the second stage of the analog-to-digital converter circuit to cancel an error in a residue voltage caused by the offsets from the quantizer of the first stage.

6. A method of claim 5, wherein digitally recombining the output of the first stage of the analog-to-digital converter circuit with the output of the second stage of the analog-to-digital converter circuit includes adding a least significant bit output from the first stage of the analog-to-digital converter circuit to a most significant bit output from the second stage of the analog-to-digital converter circuit.

7. A method of claim 5, wherein digitally recombining the output of the first stage of the analog-to-digital converter circuit with the output of the second stage of the analog-to-digital converter circuit includes digitally recombining the output of the first stage of the analog-to-digital converter circuit with the output of the second stage of the analog-to-digital converter circuit using one of: (1) software; (2) hardware or (3) firmware.

8. An analog-to-digital converter system for converting an analog input signal to a digital output signal, the system comprising:
   a first stage analog-to-digital converter circuit adapted to receive the analog input signal, to convert the analog input signal into a first stage digital output and to introduce redundancy in the first stage digital output;
   a second stage analog-to-digital converter circuit coupled to the first stage analog-to-digital converter circuit and adapted to generate a second stage digital output;
   a digital correction unit coupled to the first stage analog-to-digital converter circuit and to the second stage analog-to-digital converter circuit, the digital correction unit adapted to combine the first stage digital output and the second stage digital output to generate the digital output signal and to use the redundancy to digitally correct an offset in the digital output signal;

wherein the first stage analog-to-digital converter circuit is further adapted to introduce redundancy by modifying a quantizer of the first stage analog-to-digital converter circuit to remove an uppermost reference voltage from the first stage digital output; and wherein the quantizer of the first stage analog-to-digital converter circuit includes a plurality of comparators and wherein the plurality of comparators including a higher number of comparators than that required for generating an output necessary for the second stage analog-to-digital converter circuit.

9. An analog-to-digital converter system of claim 8, wherein the first stage analog-to-digital converter circuit is further adapted to introduce redundancy by providing a voltage headroom in the first stage digital output.

10. An analog-to-digital converter system of claim 8, wherein the first stage analog-to-digital converter circuit is further adapted to introduce redundancy by confining the first stage digital output to a fraction of an available output range.

11. An analog-to-digital converter system of claim 8, wherein the first stage analog-to-digital converter circuit is a delta-sigma analog-to-digital converter circuit.

12. An analog-to-digital converter system of claim 8, further adapted to input the first stage digital output to a second stage analog-to-digital converter circuit and further comprising a digital recombination circuit adapted to recombine the first stage digital output with the second stage digital output to cancel an error in a residue voltage caused by the offsets from the quantizer of the first stage analog-to-digital converter circuit.

13. An analog-to-digital converter system of claim 12, wherein the digital recombination circuit is further adapted to add a least significant bit first stage digital output to a most significant bit output from the second stage analog-to-digital converter circuit.

14. An analog-to-digital converter system of claim 12, wherein the digital recombination circuit is implemented using one of: (1) software; (2) hardware or (3) firmware.

15. An analog-to-digital converter system for converting an analog input signal to a digital output signal, the system comprising:

a first stage analog-to-digital converter circuit adapted to receive the analog input signal, to convert the analog input signal into a first stage digital output and to introduce redundancy in the first stage digital output, the first stage analog-to-digital converter circuit comprising:

a FLASH analog-to-digital converter circuit adapted to generate the first stage digital output, a feedback digital-to-analog converter circuit coupled to the output of the FLASH analog-to-digital converter circuit and adapted to generate a feedback signal using the first stage digital output, and an analog integrator circuit adapted to generate an integrated output signal using the analog input signal and the feedback signal;

a second stage analog-to-digital converter circuit coupled to the first stage analog-to-digital converter circuit and adapted to generate a second stage digital output using the integrated output signal;

a digital correction unit couple to the first stage analog-to-digital converter circuit and to the second stage analog-to-digital converter circuit and adapted to use the redundancy to digitally correct an offset in the digital output signal wherein the first stage analog-to-digital converter circuit is further adapted to introduce redundancy by modifying a quantizer of the first stage analog-to-digital converter circuit to remove an uppermost reference voltage from the first stage digital output; and wherein the quantizer of the first stage analog-to-digital converter circuit includes a plurality of comparators and wherein the plurality of comparators including a higher number of comparators than that required for generating an output necessary for the second stage analog-to-digital converter circuit.

16. An analog-to-digital converter system of claim 15, wherein the first stage analog-to-digital converter circuit further comprises a feed-forward circuit to combine the analog input signal to the integrated output signal.

* * * * *